United States Patent [19]

Steelman et al.

[11] 4,310,615
[45] Jan. 12, 1982

[54] IMAGE TRANSFER ELEMENT HAVING RELEASE LAYER

[75] Inventors: Ronald S. Steelman, St. Paul; Rodney J. Larkins, North St. Paul, both of Minn.

[73] Assignee: Minnesota Mining and Manufacturing Company, Saint Paul, Minn.

[21] Appl. No.: 186,147

[22] Filed: Sep. 10, 1980

Related U.S. Application Data

[63] Continuation of Ser. No. 680,666, Apr. 27, 1976, abandoned.

[51] Int. Cl.³ .......................... G03C 1/68; G03C 1/78
[52] U.S. Cl. ..................................... 430/271; 430/253; 430/272; 430/273; 430/281; 430/905; 430/912
[58] Field of Search ............... 430/271, 281, 253, 272, 430/273, 905, 912, 325

[56] References Cited

U.S. PATENT DOCUMENTS

| | | | |
|---|---|---|---|
| 3,380,831 | 3/1968 | Cohen et al. | 430/281 |
| 3,607,264 | 9/1971 | Celeste et al. | 430/271 |
| 3,639,123 | 2/1972 | Gray | 156/235 |
| 3,782,939 | 1/1974 | Bonham et al. | 96/35.1 |

OTHER PUBLICATIONS

Encyclopedia of Science & Technology, vol. 1, p. 486, (1964).

*Primary Examiner*—Jack P. Brammer
*Attorney, Agent, or Firm*—Cruzan Alexander; Donald M. Sell; Gerald F. Chernivec

[57] ABSTRACT

A presensitized light sensitive sheet structure suitable for producing a dry transfer element, comprising a transparent substrate having a release coating thereon, and overlying the release coating a photo-sensitive layer comprising a conventional photopolymerizable compound, an initiator therefor, and a binder. After light exposure to an original through the transparent substrate and development to remove unexposed portions, the remaining image portions have a greater adhesion for a receptor surface when applied thereto under pressure than the adhesion of the indicia to the transparent substrate under like pressure.

7 Claims, No Drawings

IMAGE TRANSFER ELEMENT HAVING RELEASE LAYER

This is a continuation of application Ser. No. 680,666 filed Apr. 27, 1976 now abandoned.

BACKGROUND OF THE INVENTION

This invention relates to image transfer processes and elements used therein. More particularly, the invention relates to a light sensitive element which, after image-wise exposure and removal of unexposed areas, can be utilized as a transfer element whereby individual image areas can be transferred to a receptor surface.

Dry transfer sheets consist of a transparent support carrying thereon indicia such as letters, numerals, or other symbols which can be individually transferred to a receiving surface, such as a sheet of paper. Transfer occurs by application of rubbing pressure to the rear surface of the support while the image contained on the support is in contact with the receptor, followed by peeling away the support, whereupon the image adheres to the receptor surface.

A conventional technique for manufacturing dry transfer sheets at the present time is to screen print indicia on a transparent support. Such manufacture is costly and complex, generally being undertaken only by experts in the field. For each of the numerous indicia which might be required in practice, a separate screen stencil is necessary, thereby economically limiting the manufacture to larger quantities of indicia having the greatest utility in the field. The cost of providing small numbers of special-purpose indicia for individual uses is therefore prohibitive.

Recently, transfer elements utilizing light sensitive systems have been disclosed. In U.S. Pat. No. 3,671,236 a method for photo mechanically producing multicolored images on a single substrate is disclosed. In that disclosure, the entire light sensitive diazo resin-based layer is transferred from a carrier sheet to a receptor prior to imagewise exposure thereof. Imaging and development is undertaken subsequent to transfer. There is no disclosure of transferring individual indicia comprising only the light exposed areas of the transfer element. Additionally, the light sensitive system therein is based on a diazo resin as opposed to free radical photopolymerizable materials.

Free radical photopolymerizable materials have been utilized in image transfer, generally based on the fact that a differential degree of surface tack exists between unexposed and exposed areas of a photopolymer system. Unexpected areas of the photopolymer layer generally have a greater degree of tack than exposed areas, thereby affording ability to selectively transfer unexposed areas to a receptor. In U.S. Pat. No. 3,342,593 this tack differential occurs upon heating an image-wise exposed transfer element, while in U.S. Pat. No. 3,202,508, tack differential occurs in situ upon light exposure.

In U.S. Pat. No. 3,525,615, a thixotropic gel is interspersed in the photopolymerizable layer. After imagewise exposure, unexposed areas are capable of liquifying and transferring when contacted with a receptor surface under high pressure.

In all of these transfer processes utilizing photopolymerizable materials, visual inspection of the transferrable image areas is generally unavailable because the exposed and unexposed areas of the light sensitive layer are indistinguishable and remain as an integral layer until the moment of transfer. Additionally, selective transfer of individual indicia is generally unavailable. Furthermore, after light exposure, the transferrable image portions remain light sensitive, thereby necessitating storage and transfer under subdued light.

It is of course known that a light exposed photopolymerizable stratum can be imagewise developed with a developing medium to thereby remove unexposed areas of the stratum. See Light Sensitive Systems: Chemistry and Application of Nonsilver Halide Photographic Processes, J. Kosar, J. Wiley and Sons (New York, 1965). To our knowledge, however, it has never been disclosed that the exposed polymerized image areas remaining after dvelopment can be transferred to a receptor.

British Pat. No. 1,336,065 discloses a light sensitive transfer element which can be visually inspected prior to transfer. A component capable of forming a gas upon light exposure is utilized in conjunction with a gas impervious binder resin in the transfer layer. The gas causes the bond between the transfer layer and the support to be weakened, thereby allowing removal of the exposed portions from the support with a developing medium, the unexposed portions remaining. These remaining unexposed portions are then light exposed a second time to again weaken the bond between the support and image areas and thereby provide indicia which are transferrable to a receptor element by pressure. However, this transfer system provides images with limited resolution, since the binder in the transfer layer must be able to retain the gas formed upon exposure, thereby limiting the sharpness of image boundaries. Similarly, control of the release of the transfer layer from the support is difficult to maintain. Additionally, this transfer element must be light exposed twice before transfer can be effected.

In contrast to the aforementioned transfer systems, my invention comprises a light-sensitive transfer element which, upon a single imagewise exposure and development, provides pressure transferrable indicia having excellent resolution which can be visually inspected prior to transfer. Since the light exposed portions are transferrable, indicia transfer can be undertaken at normal room temperature and light conditions utilizing a simple stylus.

DETAILED DESCRIPTION OF THE INVENTION

The basic components of the light-sensitive transfer element of my invention include a thin, flexible, transparent film support, a release coating on the support, and a photopolymerizable overlayer.

The film support should be transparent since exposure is typically undertaken through the backside of the transfer element, i.e. through the support itself. Also, a transparent support is necessary to allow visual positioning of individual indicia for transfer to a receptor. The support should also be sufficiently thin and flexible to allow transfer by stylus pressure. Typical thin, flexible, transparent film supports include polyesters, polypropylene, polyethylene, polystyrene, triacetate and transparent paper, e.g. glassine base, coated with a nonporous material such as cellulose acetate or polycarbonate.

The release layer acts essentially as a barrier to prevent the light-sensitive overlayer from firmly bonding to the transparent film support. Additionally, the release layer must be capable of retaining the exposed areas of the light-sensitive overlayer during image development, yet allow release of these same areas from the film support during image transfer. The release layer is preferably substantially impenetrable to solvent developers utilized during image development so as to prevent undercutting of the exposed image areas desired to be retained on the transfer element.

For image transfer to occur by proper functioning of the release layer, the bond between the image layer and the film support must fail during transfer by one of the following mechanisms: (1) adhesive failure at the release layer-film support interface; (2) adhesive failure at the image layer-release layer interface; or (3) cohesive failure within the release layer.

Mechanism (1) results from release materials which have lower adhesion for the film support than for the photopolymerized image layer, and have good internal strength, i.e. they are good film-formers. An exemplary material is ethyl cellulose. A filler such as colloidal silica can typically be contained in the ethyl cellulose to control adhesion thereof to the film support. In this instance, the release material should be soluble in or removable by the developing medium utilized during image development.

Mechanism (2), adhesive failure at the image layer-release layer interface, results when the release layer has greater adhesion for the film support than for the image layer. This result is generally attained by utilizing release materials having low surface energies, thereby resulting in poorer wetting by the image layer, and/or which are insoluble in the solvents utilized in coating the image layer. An exemplary material exhibiting such characteristics is a silicone resin.

Cohesive failure of the release layer, mechanism (3), results when the release material has a low internal strength, i.e. lower than either the photo sensitive layer/release layer bond or the release layer/substrate bond. Commercially available mold release agents such as Vydax AR, trade name for a telomer of tetrafluoroethylene, and Mold Wiz PS-9, trade name for a commercial mold release agent, believed to comprise a silicone, hydrocarbon, and carboxylate salt blend, are exemplary.

The preferred release mechanism is by cohesive failure of the release layer, because variables associated with the imageable overlayer, such as solvent selection, drying rates, etc. do not affect the release mechanism. Release is dependent only on the physical characteristics of the release material, which can be altered as desired by inclusion of plasticizers, resins, fillers, etc.

The photosensitive material contained in the imageable layer of my transfer element comprises an addition polymerizable, non-gaseous, i.e. having a boiling point above about 100° C. at normal atmospheric pressure, ethylenically-unsaturated compound containing at least one terminal ethylenic group, and being capable of forming a high polymer by free radical initiated, chain propagating addition polymerization, and a free radical-liberating initiator therefor.

Typical polymerizable monomers include the acrylates, e.g. methacrylate, methylmethacrylate, etc. and the corresponding ethyl esters; polyhydric alcohol esters of acrylates, e.g. tris-hydroxyethylisocyanurate-trimethylacrylate, pentaerythritoltetraacrylate, and the corresponding esters; vinyl aromatics, e.g. styrene, 1,4-divinylbenzene, naphthalene; unsaturated amides, e.g. acrylamide, methacrylamide; vinyl esters, e.g. vinyl acetate, and vinyl butyrate; and the like.

Free-radical liberating photoinitiators include any compound which liberates free radicals on stimulation by actinic radiation. Exemplary photoinitiators include the vicinal poly ketaldonyl compounds described in U.S. Pat. No. 2,367,660; the alpha-carbonyls described in U.S. Pat. Nos. 2,367,661 and 2,367,670; the acyloin ethers described in U.S. Pat. No. 2,448,828; the alpha-hydrocarbon-substituted aromatic acyloins described in U.S. Pat. No. 2,722,512; the polynuclear quinones described in U.S. Pat. Nos. 3,046,127 and 2,951,758; the triarylimidazolyl dimer/p-amino-phenyl ketone combination described in U.S. Pat. No. 3,549,367; dye-sensitized photolyzable organic halogen compounds described in U.S. Pat. Nos. 3,640,718 and 3,617,288; and the vinyl-substituted halomethyls- triazines described in commonly-assigned and copending application Ser. No. 177,851, filed Sept. 3, 1971.

For the exposed photopolymerized image areas of the transfer element to transfer to a receptor, the image area must be either tacky, i.e. the image will adhere to the receptor surface by adhesive forces, or soft, such that the image will conform to the receptor surface and adhere thereto. Suitable receptor surfaces include paper, cardboard, metal sheets and foils, wood, glass, nylon, rubber, polyethylene, polyesters, etc.

A tacky image can be attained by a variety of methods, including addition of plasticizers or plasticizing resins, monomers, pressure sensitive adhesives, free radical scavengers, soft binders, etc. to the photopolymerizable layer.

Soft image elements can be characterized as those wherein the polymer will flow when subjected to the pressure created by a stylus during transfer. This pressure is believed to be on the order of about 50 to about 1500 pounds per square inch. For example, a 0.030 inch diameter pencil point, under a one pound load, creates a pressure of about 1400 pounds per square inch. The same methods utilized to impart tack to a polymer can be used to make a polymer soft.

Fillers are typically included in the photo-sensitive layer to provide color to the image areas and/or to improve the characteristics thereof, e.g. by decreasing the tack, increasing the release, improving the image development rate, etc. Exemplary fillers include carbon black, titanium dioxide, zinc oxide, and other organic and inorganic pigments. Dispersion of pigments or other fillers in the coating composition can be enhanced by utilizing conventional dispersants, surfactants, etc.

Fillers can generally be present in the light-sensitive layer in an amount up to about 30 percent by weight of the total solids. Decreasing concentrations of pigment would correspondingly reduce the image color density. At increasing filler concentrations, image film strength decreases, correspondingly increasing image loss during development. The preferred range of filler concentration is from about one percent to about 20 percent of the total solids depending on the desired end properties of the light-sensitive layer.

Image coloration is generally desirable for registration of indicia prior to transfer. While this can be undertaken by utilizing a pigment-filled light sensitive composition, it can also be accomplished subsequent to exposure and development by utilizing conventional dyes. For example, an aqueous solution of a water soluble dye can be rubbed onto photopolymerized image areas after development until dye penetration and corresponding coloration of the image areas occur. By utilizing dyes, a variety of colors can be provided on a single transfer sheet.

The light-sensitive layer can be considered to contain three components—the photopolymerizable monomer, an initiator therefor, and a binder (wherein the binder is in actuality a blend of the remaining materials such as plasticizers, fillers, etc.). The ratio of these three components is important in determining the final properties of the transfer layer. For example, if too little photopolymerizable monomer or too much binder is present, image resolution and differential solubility of the image layer will be less than optimum. At the other extreme, the light-sensitive layer may be too soft and fluid before exposure or the exposed image areas may be too hard for efficient transfer. While the optimum range will generally depend on the particular photopolymerizable monomer and binders, typically the light-sensitive layer contains from about 25 percent to about 90 percent monomer by weight based on total solids.

Initiator concentration is important in that at very low concentrations the polymerization process may be too slow or poor conversion of monomer to polymer can occur (although this poor conversion can effectively add to the tack of the exposed transfer areas). Too great a concentration can cause extensive crosslinking, thereby resulting in loss of tack, halation, etc., and the added possibility of post-development light sensitivity. Initiator concentration from about 0.5 to about 5.0 percent by weight based on the total solids is generally satisfactory, depending on the particular initiator and monomers chosen.

A protective layer can be applied over the light-sensitive layer to prevent oxygen inhibition and provide ease of handling the sheet structure if the photopolymer is tacky.

Typical protective layers include polyvinyl alcohol, gelatin, gum arabic, methyl vinyl ether/maleic anhydride copolymers, polyvinyl pyrrolidones, etc. The protective layer must be soluble in developer solutions utilized in development of the imagewise exposed transfer element.

Alternatively, a protective cover sheet having a release coating, e.g. silicone, can be laminated to the light sensitive layer to provide protection thereto. This cover sheet can be stripped from the photo-sensitive layer after imagewise exposure. Imagewise exposure can be undertaken by conventional exposure units such as carbon arc, mercury vapor, pulsed xenon, etc.

Developer solutions utilized should contain a solvent for the unexposed areas of the light-sensitive layer. Development action can occur by dissolving one or more components comprising the light-sensitive layer. For example, if a water soluble component, such as the binder resin or the monomer, is utilized, the developer can be an aqueous system.

When the preferred binder resin, namely a carboxylated vinyl resin, is utilized, a dilute base is the preferred developer, since the binder resin is soluble therein. Organic solvents such as ethyl alcohol, isopropanols, etc. can also be utilized in conjunction with water, if desired.

The developer solution can be used as a bath or in the form of a spray. Removal of the unexposed areas of the photopolymer layer can be generally improved by brushing, rubbing with a wet sponge, or other conventional procedures.

My invention will be further illustrated by the following non-limiting examples, wherein all parts are by weight unless otherwise indicated.

EXAMPLE 1

A release composition was prepared by mixing:

| | |
|---|---|
| 75 grams | Mold Wiz PS-259 (a trade name for a 10% dispersion believed to be a blend of silicone, a hydrocarbon and a carboxylate salt) |
| 10 grams | Vydax AR (trade name for a 20% solids solution of a short chain telomer of tetrafluoroethylene in Freon TF) |
| .5 gram | Polyethylene Oxide |
| 50 grams | Trichloroethylene |

The resulting dispersion was cascade coated onto a 3 mil transparent polyester base and dried at 140° F. for two minutes to provide a dry coating weight of 120 milligrams per square foot.

A photosensitive composition was prepared by first milling on a sand or ball mill:

| | |
|---|---|
| 8.7 grams | Gelva $C_5V_{16}$ (trade name for carboxylated polyvinyl acetate copolymer) |
| 1.62 grams | Cabot Sterling R (trade name for carbon black) |
| 9.8 grams | ethyl alcohol |
| 17.4 grams | methyl ethyl ketone |

The milled material was added to a mixture of the following components followed by through agitation:

| | |
|---|---|
| 3.5 grams | pentaerythritol tetraacrylate |
| 11.9 grams | triacrylate of (tris-2-hydroxyethyl) isocyanurate |
| 12.9 grams | Daratak 74L (trade name for a 55 percent solids in water acrylate copolymer adhesive emulsion) |
| 1.9 gram | Pycal 94 (trade name for a polyoxyethylene aryl ether flexibilizer) |
| 0.24 gram | FC-430 (trade name for a fluorochemical surfactant) |
| 1.4 gram | Polyox N-10 (trade name for a polyethylene oxide) |
| 0.42 gram | 2(p-methoxy styryl)-4,6-bis (trichlormethyl)-s-triazine |
| 31.0 grams | methyl ethyl ketone |

The photo-sensitive composition was knife coated on the dry release layer and dried at 180° F. for four minutes to provide a dry coating weight of 2.5 grams per square foot.

A top coat solution was prepared by mixing:

| | |
|---|---|
| 7 grams | Gelvatol 20-30 (trade name for polyvinyl alcohol) |
| 70 grams | water |
| 23 grams | methyl alcohol |

The resulting solution was knife coated over the photosensitive layer and dried at 180° F. for two minutes to provide a dry coating weight of 150 milligrams per square foot.

The sheet construction was exposed through the polyester backing to a right-reading negative for two minutes in a NuArc pulsed xenon exposure unit.

The exposed sheet was then placed in a development sink with the coated side up. A developer solution of 1% sodium silicate in water was liberally poured on the sheet. Development was accomplished by gently rubbing the wet sheet with a soft cotton pad, whereupon the unexposed areas were removed. After development, the sheet was rinsed with clear tap water and carefully blotted dry.

Transfer occurred by placing the indicia, i.e. the image areas on the sheet, in contact with the receptor paper and rubbing the polyester backing with a dull pencil. The polyester carrier sheet was then peeled away whereupon the indicia adhered to the receptor paper.

In this instance, transfer occurred due to cohesive failure within the release layer.

EXAMPLE 2

A release composition was prepared by mixing the following components:

| | |
|---|---|
| 68.1 grams | GE Silicone No. 4191 (trade name for a 30 percent solids silicone resin solution in xylene) |
| 2.7 grams | GE Catalyst No. 4192 (trade name for a 50% solids silicone resin curative solution in xylene) |
| 27 grams | GE Accelerator No. 4193 (trade name for a cure accelerator) |
| 635 grams | toluene |
| 635 grams | methyl ethyl ketone |

The mixture was cascade coated on a 3 mil transparent polyester base, dried and cured for four minutes at 190° F., to provide a dry coating weight of 25 milligrams per square foot.

The photo-sensitive layer of Example 1 was applied over the dry release coating and dried as per Example 1.

A top coat solution was prepared by mixing:

| | |
|---|---|
| 2 grams | hydroxyethyl cellulose |
| .1 gram | Triton X-100 (trade name for alkylarylpolyether alcohol) |
| 80 grams | water |
| 20 grams | methyl alcohol |

The resulting solution was knife coated over the photo-sensitive layer and dried at 180° F. to provide a final coating weight of 200 milligrams per square foot.

The coated sheet was exposed, developed, and the resulting indicia transferred as per Example 1.

This sheet construction has properties very similar to Example 1 except that upon transfer, image release occurred at the interface of the photo-sensitive and release layers.

EXAMPLE 3

A release composition was prepared by mixing the following components:

| | |
|---|---|
| 100 grams | Mold Wiz PS-259 (trade name for a 10% solids in toluene blend of silicone, hydrocarbon, and a carboxylate salt) |
| 100 grams | Toluene |

The composition was cascade coated onto a 3 mil transparent polyester base and dried at 140° F. for three minutes, providing a dry coating weight of 100 milligrams per square foot.

The photo-sensitive layer of Example 1 was applied over the dry release coating and dried as per Example 1.

A piece of the 3 mil polyester coated with the release layer of Example 2 was used as a liner and laminated to the photo-sensitive layer. The resulting sandwich was exposed as per Example 1, the liner peeled away, and the sheet developed as per Example 1. The resulting indicia were transferred by placing the transfer element on a paper receptor, and passing the sheets between heated nip rolls operating at 210° F. The polyester backing was separated as it emerged from the rolls whereupon the indicia were effectively transferred to the receptor.

EXAMPLE 4

A release composition was prepared by mixing the following components:

| | |
|---|---|
| 7.5 grams | Methocel 15 (trade name for methyl cellulose) |
| 22.5 grams | normal propyl alcohol |
| 120 grams | water |
| 20 grams | Nalcoag 1050 (trade name for a 35 percent solids aqueous colloidal silica dispersion) |
| 1 gram | Triton X-100 (trade name for alkylaryl polyether alcohol) |

The composition was knife coated onto a 3 mil transparent polyester base and dried at 180° F. for three minutes, resulting in a dry coating weight of 0.6 grams per square foot.

The photo-sensitive layer and top coat of Example 1 were applied over the dry release layer. Exposure, development, and transfer were the same as in Example 1. Excellent visible image release was noted.

EXAMPLE 5

The release layer of Example 1 was overcoated with a photo-sensitive composition prepared by mixing:

| | |
|---|---|
| 3 grams | trimethylol propane trimethacrylate |
| 2 grams | trimethacrylate of (tris hydroxyethyl) isocyanurate |
| 2.5 grams | Gelva $C_5V_{16}$ (trade name for a carboxylated polyvinyl acetate copolymer) |
| 2.2 grams | Daratak 74L (trade name for a 55 percent solids in water acrylate copolymer adhesive emulsion) |
| 0.5 gram | Polyox N-10 (trade name for polyethylene oxide) |
| 0.12 gram | 2(p methoxy styryl)-4,6-bis (trichloromethyl)-s-triazine |
| 0.5 gram | Pycal 94 (trade name for a flexibilizer) polyoxyethylene aryl ether |
| 1.1 gram | Sudan Red 0 (trade name for a red dye) |
| 15 grams | methyl ethyl ketone |
| 5 grams | ethyl alcohol |

The photopolymerizable coating was dried at 180° F. for three minutes providing a dry coating weight of 1.5 grams per sqare foot.

The top coat of Example 1 was applied over the photo-sensitive layer.

The sheet was imaged through the transparent polyester backing to a right reading negative for one minute on a NuArc pulsed xenon exposure unit, and developed with a solution of 3.7 percent sodium acetate, 1.2 percent Triton X-100 (trade name for alkylaryl polyether alcohol), 46.3 percent water, and 48.8 percent ethyl alcohol.

Transfer was affected by placing the red indicia in contact with a transparent polyester receptor and rubbing the polyester backing with a dull pencil.

EXAMPLE 6

The release layer of Example 1 was overcoated with a photo-sensitive composition prepared by mixing:

| 3 grams | trimethylol propane trimethacrylate |
| --- | --- |
| 2 grams | trimethacrylate of (tris hydroxyethyl) isocyanurate |
| 2 grams | VERR (trade name for vinyl acetate/vinyl chloride resin) |
| 2 grams | Gelva RA 788 (trade name for an acrylate copolymer) |
| 0.5 grams | dibutyl phthalate |
| 0.2 grams | Sudan Green (trade name for a green dye) |
| 0.15 gram | 2-(p-methoxy styryl)-4,6-bis(trichloromethyl)-s-triazine |
| 18.8 grams | methyl ethyl ketone |
| 11.3 grams | ethyl alcohol |
| 1.0 gram | water |

The photopolymerizable coating was dried at 180° F. for four minutes providing a dry coating weight of 1.8 grams per square foot.

After overcoating as per Example 1, the sheet was exposed through the transparent polyester backing for one minute with a pulsed xenon light source at a distance of 18 inches.

Image development was undertaken utilizing a solution of 40 percent by volume n-propyl alcohol and 60 percent by volume water.

Indicia were transferred to a receptor utilizing a simple stylus.

EXAMPLE 7

The release layer of Example 1 was overcoated with a photo-sensitive composition prepared by mixing:

| 1.5 grams | pentaerythritol tetraacrylate |
| --- | --- |
| 4.5 grams | triacrylate of (tris 2-hydroxyethyl) isocyanurate |
| 3.0 grams | Butvar 76 (trade name for a polyvinyl butyral resin) |
| 5.0 grams | Gelva RA 788 (trade name for an acrylate copolymer) |
| 0.15 gram | 2-(p-methoxy styryl)-4,6-bis(trichloromethyl)-s-triazine |
| 0.5 gram | dibutyl phthalate |
| 0.1 gram | Sudan Red O (trade name for a red dye) |
| 27.0 grams | methyl ethyl ketone |

The photopolymerizable coating was dried at 180° F. for four minutes to provide a dry coating weight of 1.5 grams per square foot.

A silicone-coated polyester sheet was laminated to the photo-sensitive layer as per Example 3. Exposure was undertaken through the transparent backing for 1.5 minutes to a pulsed xenon light source at a distance of 18 inches, after which the silicone-coated liner was peeled away.

Development of the imaged photo-sensitive layer was undertaken utilizing a solution comprising 75 percent isopropanol and 25 percent water by volume.

Transfer of the red indicia was undertaken utilizing a stylus.

EXAMPLE 8

The release layer of Example 1 was overcoated with a photo-sensitive composition prepared by mixing:

| 3.0 grams | trimethylol propane trimethacrylate |
| --- | --- |
| 2.0 grams | tris methacrylate of (tris hydroxyl ethyl) isocyanurate |
| 2.0 grams | EAB500-1 (trade name for a cellulose acetate butyrate resin) |
| 5.0 grams | Gelva RA-788 (trade name for an acrylate copolymer) |
| 0.5 gram | Pycal 94 (trade name for a (polyoxyethylene aryl ether flexibilizer) |
| 0.2 gram | 2(p-methoxy styryl)-4,6-bis-trichloromethyl)-s-triazine |
| 0.1 gram | Sudan Red O (trade name for a red dye) |
| 18.0 grams | methyl ethyl ketone |

The photopolymerizable coating was dried at 180° F. for three minutes, providing a dry coating weight of 1.8 grams per square foot.

After providing a top coat as per Example 1, the element was exposed and developed as per Example 7, whereupon indicia transferable by stylus pressure were obtained.

EXAMPLE 9

A release composition was prepared by mixing the following:

| 75 grams | Mold Wiz PS-259 (trade name for a 10 percent solids in toluene blend of silicone, wax and a carboxylate salt) |
| --- | --- |
| 10 grams | Vydax AR (trade name for a 20 percent solids solution of a short chain telomer of tetrafluoroethylene in Freon TF, a fluorocarbon solvent) |
| 25 grams | Polyox N10 (trade name for polyethylene oxide) in trichloroethylene |

The mixture was knife coated onto a transparent polyester base and dried at 140° F. for two minutes providing a dry coating weight of 150 milligrams per square foot.

Over this layer was coated a photopolymerizable composition prepared by mixing:

| 1.0 gram | Pentaerythritol tetraacrylate |
| --- | --- |
| 3.4 grams | triacrylate of (tris 2-hydroxyethyl) isocyanurate |
| 1.9 gram | Thiokol LP-31 (trade name for a liquid polysulfide polymer) |
| 4.0 grams | 20 percent solids solution of dimethylaminoethyl methacrylate homopolymer in methyl ethyl ketone |
| 1.0 gram | Santicizer 8 (trade name for N-ethyl, O,p-toluenesulfonamide) |

-continued

| | |
|---|---|
| 0.2 gram | 2-methyl-4,6 bis(trichloromethyl) s-triazine |
| 0.1 gram | 9,10-dimethoxyanthracene |
| 0.7 gram | 10 percent solids dispersion of FC-430 (trade name for a fluorocarbon surfactant) in methyl ethyl ketone |
| 0.15 gram | Uvinul 400 (trade name for 2,4-dihydroxy-benzophenone) |
| 8.3 grams | millbase from Example 9 |
| 8.0 grams | methyl ethyl ketone |
| 3.0 grams | methyl alcohol |

The coating was dried at 180° F. for four minutes, providing a dry coating weight of 1.8 grams per square foot.

A solution was prepared by mixing:

| | |
|---|---|
| 7 grams | Gelvatol 20-30 (trade name for a polyvinyl alcohol resin) |
| 0.46 gram | Triton X-100 (trade name for alkylaryl polyether alcohol) |
| 75 grams | water |
| 25 grams | methyl alcohol |

This solution was coated on a second polyester base and dried at 190° F. for 2.5 minutes to a dry coating weight of 100 milligrams per square foot. This layer was laminated to the tacky photopolymerizable layer of the first sheet and the polyester base peeled away from the polyvinyl alcohol layer.

The transfer element was exposed through a negative mask to ultraviolet light through the polyester backing.

The imaged light sensitive layer was developed utilizing a one percent by weight aqueous ammonia developer and slight rubbing action, whereupon the unexposed portions of the light sensitive layer were removed.

The remaining indicia can be transferred to a receptor by utilizing a simple stylus.

EXAMPLE 10

A millbase was prepared by ball milling a mixture of:

| | |
|---|---|
| 11.4 grams | Gelva C5V16 (trade name for a carboxylated polyvinyl acetate copolymer) |
| 2.2 grams | carbon black |
| 3.48 grams | water |
| 13.5 grams | 95/5 parts by weight ethanol/isopropanol |
| 26.8 grams | methyl ethyl ketone |

This millbase was added to a mixture of:

| | |
|---|---|
| 2.7 grams | polyethylene glycol diacrylate |
| 8.9 grams | pentaerythritol tetraacrylate |
| 7.7 grams | triacrylate of (tris 2-hydroxyethyl) isocyanurate |
| 21.2 grams | 10 percent solids solution of polyethylene oxide in water |
| 0.96 gram | Pycal 94 (trade name for a polyoxyethylene aryl ether flexibilizer) |
| 0.66 gram | phenanthrenequinone |

This light sensitive composition was knife coated onto a release layer prepared as per Example 1 on a 3 mil transparent polyester base and dried at 180° F. for three minutes, providing a dry coating weight of 1.5 grams per square foot.

A second millbase was prepared by ball milling a mixture of:

| | |
|---|---|
| 5.7 grams | Gelva C5V16 (trade name for a carboxylated polyvinyl acetate copolymer) |
| 1.0 gram | carbon black |
| 13.4 grams | methyl ethyl ketone |
| 6.7 grams | ethanol |
| 1.0 gram | water |

This was added to a mixture of:

| | |
|---|---|
| 2.9 grams | polyethylene glycol diacrylate |
| 9.4 grams | pentaerythritol tetraacrylate |
| 8.2 grams | triacrylate of (tris 2-hydroxyethyl) isocyanurate |
| 13.0 grams | Daratak 74L (trade name for a 55 percent solids in water acrylate copolymer adhesive emulsion) |
| 10.6 grams | 10 percent solids solution of polyethylene oxide in water |
| 0.5 gram | Pycal 94 (trade name for a polyoxyethylene aryl ether flexibilizer) |
| 0.66 grams | phenanthrenequinone |
| 25.9 grams | methyl ethyl ketone |

This composition was knife coated over the first light sensitive composition and dried at 180° F. for four minutes to provide a dry coating weight of 1.0 grams per square foot.

After topcoating, exposing, and developing as per Example 1, a transfer element having black indicia capable of easy transfer to receptor surfaces was obtained.

What is claimed is:

1. A presensitized light sensitive sheet structure suitable for producing a dry transfer element, comprising a thin, flexible, transparent substrate having a release coating thereon, and overlying said release coating and releasably bonded thereby to said transparent substrate a photosensitive layer comprising an addition polymerizable, non-gaseous ethylenically-unsaturated compound containing at least one terminal ethylenic group, a free radical-liberating photo initiator therefor, a pressure-sensitive adhesive, and a binder, said photosensitive layer, after image wise exposure thereof to actinic radiation and removal of unexposed portion of said layer, having greater adhesion at normal room temperature to a receptor surface when applied thereto under pressure than the adhesion of said photosensitive layer to said transparent substrate under like pressure.

2. The light sensitive sheet structure of claim 1 further comprising a protective layer over said photosensitive layer.

3. The sheet structure of claim 2 wherein said protective layer comprises polyvinyl alcohol.

4. The sheet structure of claim 1 wherein said release coating comprises a silicone resin.

5. The sheet structure of claim 1 wherein said release coating comprises a telomer of tetrafluoroethylene.

6. The sheet structure of claim 1 wherein said binder comprises a pigmented carboxylated polyvinyl acetate copolymer.

7. The sheet structure of claim 1 wherein said transparent substrate is a polyester.

* * * * *

UNITED STATES PATENT AND TRADEMARK OFFICE
CERTIFICATE OF CORRECTION

PATENT NO. : 4,310,615
DATED : January 12, 1982
INVENTOR(S) : Steelman et al

It is certified that error appears in the above—identified patent and that said Letters Patent is hereby corrected as shown below:

Face of the Patent, under the title, "Related U.S. Application Data", rewrite Section [63] to read:

--Continuation of Serial No. 680,666, filed April 27, 1976, now abandoned, which is a continuation of Serial No. 523,430, filed November 13, 1974, now abandoned.--

Column 1, line 5, rewrite the paragraph to read:

--This is a continuation of application Serial No. 680,666, filed April 27, 1976, now abandoned, which is a continuation of Serial No. 523,430, filed November 13, 1974, now abandoned.--

Signed and Sealed this

Twenty-second Day of June 1982

[SEAL]

Attest:

*Attesting Officer*

GERALD J. MOSSINGHOFF
*Commissioner of Patents and Trademarks*